US005544772A

United States Patent [19]

Soave et al.

[11] Patent Number: 5,544,772

[45] Date of Patent: Aug. 13, 1996

[54] FABRICATION OF A MICROCHANNEL PLATE FROM A PERFORATED SILICON

[75] Inventors: Robert J. Soave, Cortland, N.Y.; Alan M. Then, Auburn, Mass.; Steven M. Shank, Ithaca, N.Y.; G. William Tasker, West Brookfield, Mass.

[73] Assignee: Galileo Electro-Optics Corporation, Sturbridge, Mass.

[21] Appl. No.: 507,027

[22] Filed: Jul. 25, 1995

[51] Int. Cl.[6] .............................. B44C 1/22; C03C 15/00; H01L 21/00

[52] U.S. Cl. .................................. 216/2; 216/56; 216/66; 156/643.1; 156/644.1; 156/657.1; 205/655

[58] Field of Search .............................. 156/643.1, 644.1, 156/657.1, 662.1; 216/2, 8, 56, 66; 204/129.3, 129.55

[56] References Cited

U.S. PATENT DOCUMENTS 5,205,902 4/1993 Horton et al. ............................ 216/56

*Primary Examiner*—William Powell

*Attorney, Agent, or Firm*—Watson Cole Stevens Davis, P.L.L.C.

[57] ABSTRACT

Manufacture of a microchannel plate may be improved using photoelectrochemical etching and thin film activation such as CVD and nitriding and oxidizing wall surface portions of pores formed in the substrate. The pore pattern may be changed by oxidizing and etching the substrate prior to activation.

23 Claims, 7 Drawing Sheets

FABRICATION OF A MICROCHANNEL PLATE FROM A PERFORATED SILICON

BACKGROUND OF THE INVENTION

The invention pertains to a method for fabricating a microchannel plate (MCP) from a perforated silicon workpiece produced by photoelectrochemical etching (PECE).

There are various known methods for manufacturing microchannel plates (MCPs). It is instructive to begin by examining the relative capabilities of such known methods. The traditional method for manufacturing an MCP substrate uses a multi-fiber draw (MFD) technique employing reduced-lead silicate glass (RLSG). Another method employs reactive particle etching (RPE) and thin-film activation. The table below summarizes the relative capabilities, and cost of these methods.

Comparison of Known Methods for Fabricating MCP Substrates
MFD: Multifiber Draw of RLSG-MCPs
RPE: Reactive Particle Etching

| Capability | MFD | RPE |
|---|---|---|
| D Pore Diamenter | ≧5 μm | 1–2 μm |
| P Pitch | ≧6 μm | ≧3 μm |
| α length/D | 30–120 | 30–40 |
| A Area | 1–100 $cm^2$ | 1–100 $cm^2$ |
| Cost | moderate | moderate |

It is desirable to improve and expand each of the categories to thereby improve the resulting products. It is also desirable that newly devised process steps may be employed to improve the manufacturing process. Such process steps may result in a new process category or may be combined with satisfactory elements of known processes. In either case, improvements in quality and productivity may be achieved.

SUMMARY OF THE INVENTION

The present invention is based upon the discovery that the manufacture of a microchannel plate may be improved using photoelectrochemical etching and thin film activation.

In an exemplary embodiment, the invention comprises the steps of defining a pore pattern on an etchable wafer; photoelectrochemical etching (PECE) the wafer to produce an array of anisotropic pores in the wafer corresponding to the defined pattern; and activating the pores. The activation step includes forming an electron emissive surface on the walls of the pores. In the case where the wafer is a conductive material, such as silicon (Si), an isolation layer is formed on the walls of the pores to separate the wafer from the emissive layer. Alternatively, the conductive wafer may be transformed to a less conductive material prior to activation.

DESCRIPTION OF THE INVENTION

Figure 1:
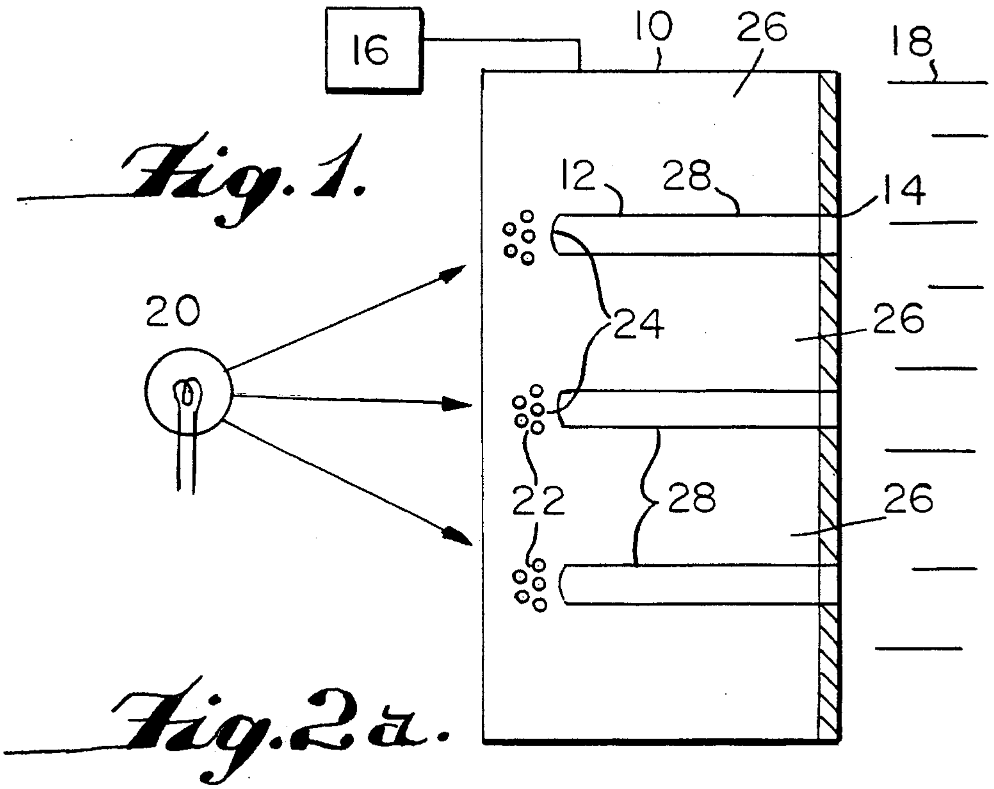
FIG. 1 is a schematic illustration of a method employing photoelectrochemical etching (PECE) for manufacturing an MCP.

The process for fabricating a microchannel plate is shown schematically in FIG. 1. According to the invention, an array of pores is produced by photoelectrochemical etching (PECE) in an etchable substrate or wafer to form a perforated workpiece. The pores are then activated by thin film processing techniques.

Photoelectrochemical etching (PECE) is a processing method illustrated schematically in FIG. 1 for etching a silicon (Si) substrate or wafer 10 with deep, highly anisotropic pores 12. In the process, an array of etch pits 14 is defined on one side of a n-type silicon wafer 10. The wafer 10 is then connected as an anode 16 in a electro-chemical cell and the patterned surface is exposed to a hydrofluoric-acid 18 containing electrolyte. The wafer 10 is simultaneously illuminated from the backside, i.e., the side without the etch pits by a source 20. The illumination produces a high concentration of minority charge carriers 22 (holes) at the base 24 of the etch pit 14 due to a focusing effect of the electric field lines in the space-charge region, whereby concave surface regions are more efficient in collecting holes than convex ones. The plane separating the space-charge region from the bulk lies below the tips 24 of the pores 12 advancing into the bulk. Accordingly, the region 26 between the pores 12 is depleted and all minority carriers 22 (holes) which are effectively collected at the tips or base 24 of the pores 12 with none left to promote etching of the sidewalls 28 of the pores. The base 24 of the pits 14 thus etch rapidly while the sidewalls 28 of the pits 14 do not etch, allowing for the formation of highly anisotropic pores 12. A typical etch rate for such a process is 0.5 μm/min.

PECE is ideally suited for producing arrays of pores in silicon with diameters (D) ranging from 1 μm to 10 μm and lengths (L) ranging from a few microns to hundreds of microns. In addition, channels may be etched at a bias angle ranging from 0°–10° with respect to the substrate normal. Pores may be etched entirely through a wafer 10, thereby producing a perforated silicon workpiece. Alternatively, the pores may be etched partly through the wafer and the workpiece released. PECE can thus be used to produce a regular array of deep, highly anisotropic channels in a silicon substrate. According to the invention, the etched substrate is activated by thin film processing techniques, hereinafter described, to produce a micromachined electron multiplier.

The fabrication sequence described herein includes a sequence of thin film processing steps designed to produce layers of materials with the electrical and physical properties necessary to support electron multiplication. These layers include current-carrying semiconductive films with specific sheet resistances and films that have suitable secondary electron emissive characteristics. In addition, thin-film methods are described to modify the dimensions of the pores in the workpiece after the PECE step. Finally, techniques are described to overcome the mechanical limitations of the lamina during processing.

Figure 2A:
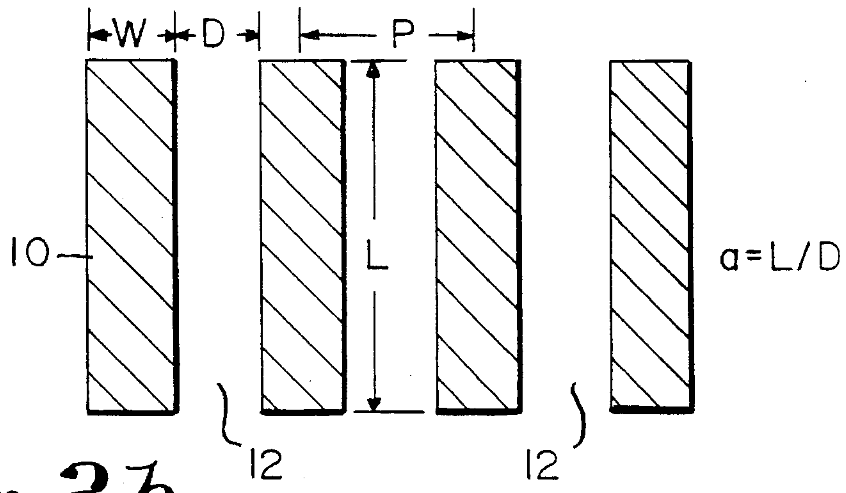
FIG. 2A is a cross-section of a Si substrate containing pores produced by PECE.

According to one aspect of the invention, the pore size and placement are characterized by the dimensions defined in FIG. 2A. Each pore 12 is characterized by the width (D) and the length (L). The spacing between the pores is characterized by pitch (P). (In a circular pore, D is the diameter.) The channel wall thickness (W) is equal to the pitch minus the pore diameter (P-D). The aspect ratio of the channel is defined as $\alpha=L/D$. In one embodiment of the invention, the pores 12 are arranged in a rectangular array with the pore width (D) equal to the wall thickness (W), as shown. Thus, P=2D. It should be apparent to those skilled in the art that other spatial arrangements of pores 12, pore geometries, and combinations of pore width/wall thickness are possible. For example, a hexagonal arrangement may be produced. The pore width may be larger than the wall thickness or smaller than the wall thickness. Also, the pore arrangement may be aperiodic.

Figure 2B:
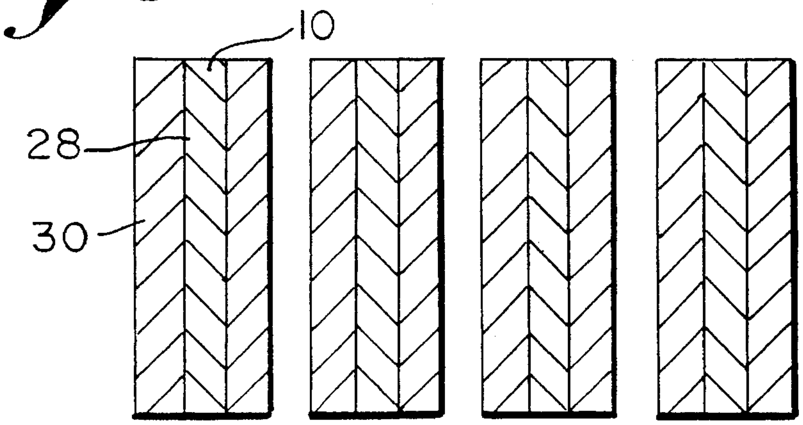
FIG. 2B is a cross-section of the Si substrate illustrated in FIG. 2 which has been partially oxidized to produce a thermally grown $SiO_2$ layer.

As shown in FIG. 2B, after the perforated silicon workpiece 10 is produced, the wall surface 28 may be converted to silicon dioxide ($SiO_2$) 30 by thermal oxidation. This is done either to electrically isolate the silicon, or to modify the array dimensions. Generally, oxidation may be conducted via pyrogenic steam in the temperature range 1000°–1200° C. Typically, a $H_2/O_2$ ratio of about ~2:1 may be used, and a chlorine (TCA, HCl) source may also be included.

Silicon dioxide is less dense than silicon. Thus, there is a volume expansion associated with the oxidation of the silicon wall 28. The change in volume when the surface 28 of a material is oxidized is known as the Pilling-Bedworth ratio, which equals 2.2 for a flat silicon surface. For concave silicon surfaces such as the interior wall of pores 12, this ratio is higher than that for a flat surface. Thus, for every micron of silicon consumed, 2.2 microns or more of oxide are grown; and the diameter of the pore decreases during the oxidation, as shown in FIG. 2B.

Volume expansion during oxidation produces compressive stress in the sample surface, which can cause the workpiece to bow. In the case of workpieces having 2.5 μm pores on 4 μm centers with an α of ~30, bowing takes place as the thickness of the oxide exceeds ~0.5 μm. The bowing can be so severe so as to cause the piece to roll-up upon itself if the oxidation is allowed to continue. If the wall thickness is substantially greater, or the overall length of the pores is higher, it is likely that substantially more oxide could be grown without bowing of the workpiece. Also, as discussed hereinafter, the workpiece may be completely converted to oxide, thus removing the stress caused by materials differences and allowing the workpiece to remain flat.

Figure 3:
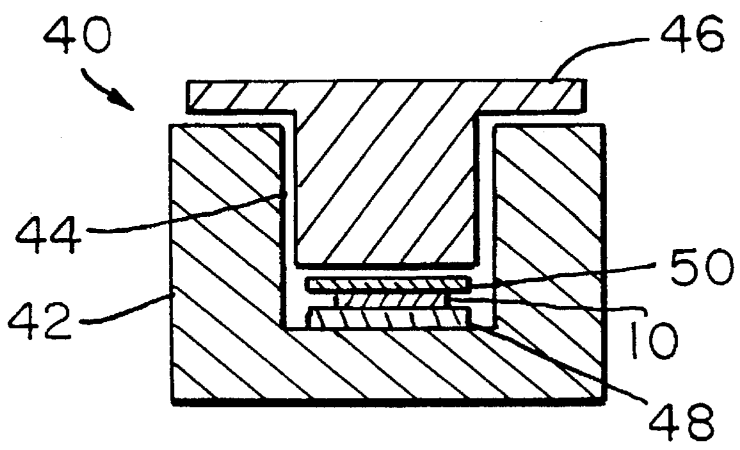
FIG. 3 is a schematic diagram of a fixture employed to prevent warping of the Si substrate during oxidation.

One method successfully employed to prevent bowing is to physically constrain the sample during oxidation with a weighted fixture 40, as shown in FIG. 3. In an exemplary embodiment, the pressure exerted on the workpiece by the fixture presently used is ~100 g/cm$^2$. The fixture 40 may be in the form of a vessel 42 having an opening 44 for receiving a weight 46. The workpiece or wafer 10 is constrained between respective, confronting surface portions 48 and 50 of the vessel 42 and the weight 46. The fixture 40 should be of a material that is compatible with the thermal oxidation process, such as fused silica. The surface portions 48 and 50 of the fixture 40 that contact the workpiece 10 must be flat to properly constrain the workpiece. Unless precautionary steps are taken, it is possible that the workpiece 10 may bond to the surface portions 48 and 50 of the fixture during oxidation. This can be eliminated by choosing a material and surface texture that prevents this bonding. In an exemplary embodiment of the invention, the surface portions 48 and 50 each comprise a silicon wafer coated with silicon nitride. The surface of each wafer 48 and 50 that contacts the workpiece 10 is not polished. This configuration successfully constrains the sample without allowing the workpiece to bond to the fixture.

Figure 2C:
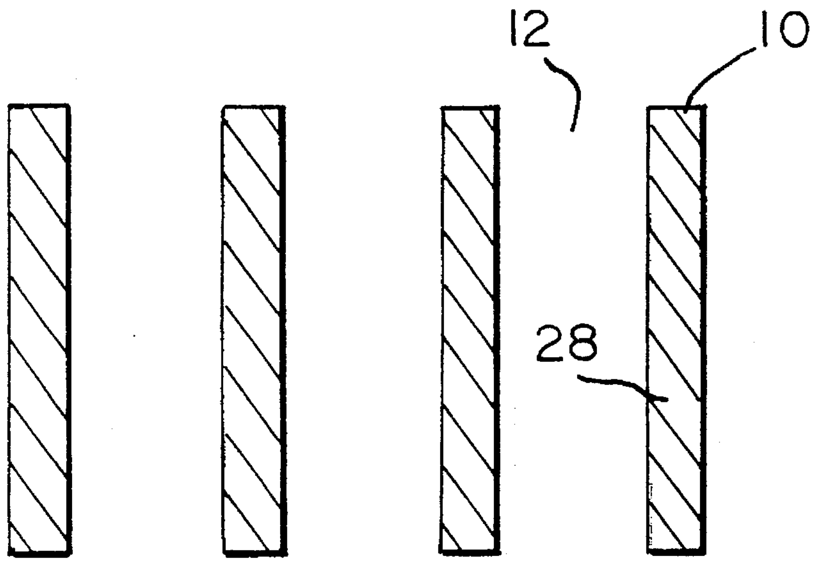
FIG. 2C is a cross-section of the substrate illustrated in FIG. 2B which has been etched in an HF solution to remove the $SiO_2$ layer.

In one embodiment of the invention, it may be desirable to thin the silicon wall 28 of the workpiece 10. This may be done by consuming the silicon by thermal oxidation, as illustrated in FIG. 2B, and then, removing the oxide 30 by etching in hydrofluoric acid (HF), which etches $SiO_2$ without etching Si. This decreases the thickness W of wall 28 and increases width D of the silicon pores 12 without changing the pitch P of the array, as shown in FIG. 2C.

The steps described thus far produce an array of pores with the desired dimensions of D, P, and W. The following describes the steps for activating the channels to form continuous dynode electron multipliers.

Figure 4A:
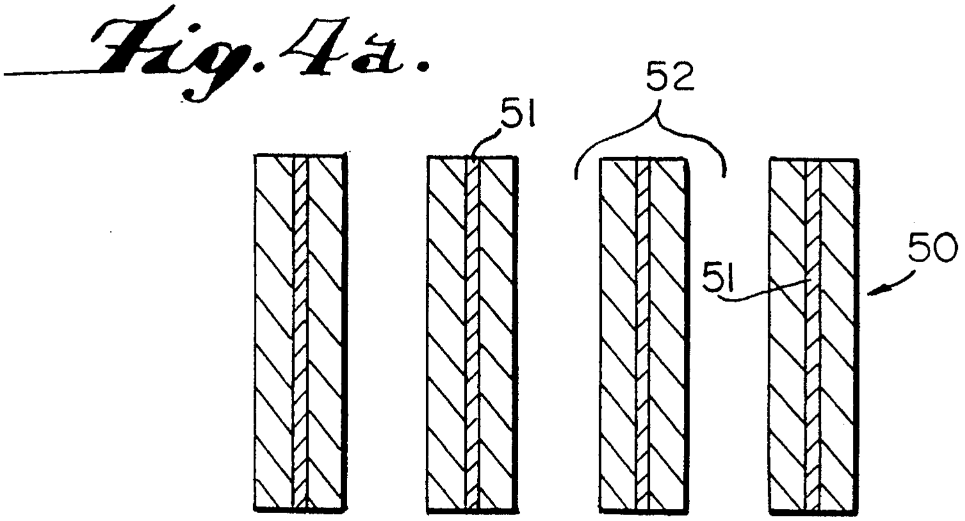
FIG. 4A is a cross-section of the substrate illustrated in FIG. 2C which has been oxidized to produce an electrical isolation layer.
Figure 4B:
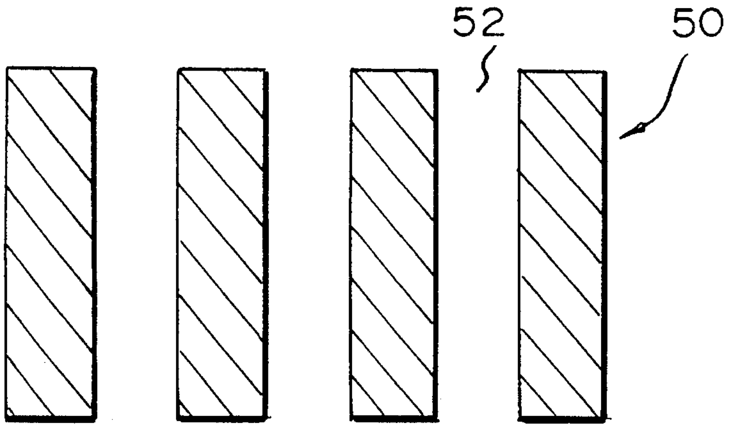
FIG. 4B is a cross-section of the substrate illustrated in FIG. 4A which has been oxidized to fully consume the Si.
Figure 4C:
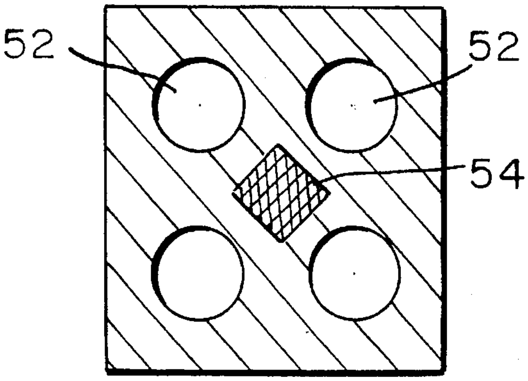
FIG. 4C is a top plan view of an oxidized Si substrate with a rectangular array of pores with unoxidized Si along diagonals between the pores.
Figure 4D:
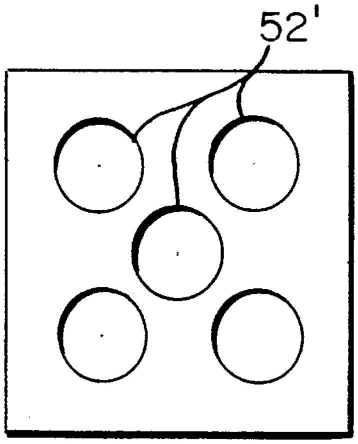
FIG. 4D is a top plan view of an oxidized Si substrate with a hexagonal array of pores where the space between pores is more uniform and hence fully oxidized.

As shown in FIG. 4A, when a conductive substrate 50 such as Si is employed, it first becomes necessary to electrically isolate the substrate. One method for isolating the substrate 50 is by direct thermal oxidation of the silicon, as described previously. The pore diameter is decreased as the silicon is converted to oxide and α increases, as shown in FIG. 4A. For the embodiment of a rectangular array of pores 52, it has been found that such a workpiece may be oxidized until the silicon 51 between adjacent pores 52 is consumed, as shown in FIG. 4B. However, unconsumed silicon 54 may be present along the diagonal between pores 52, as shown in FIG. 4C. The stress thus created by oxidation of this residual Si may cause the piece to warp and it may even crack. It is possible to eliminate this effect by changing the placement of the pores in the array. For example, the pores 52' may be arranged in a hexagonal arrangement, shown in FIG. 4D. With this configuration, the distance between nearest-neighbors is more uniform and may allow oxidation to continue until the entire silicon structure is consumed and converted to silicon dioxide. Other methods of isolating the Si substrate are described in U.S. Pat. No. 5,378,960, herein incorporated by reference.

Figure 5A:
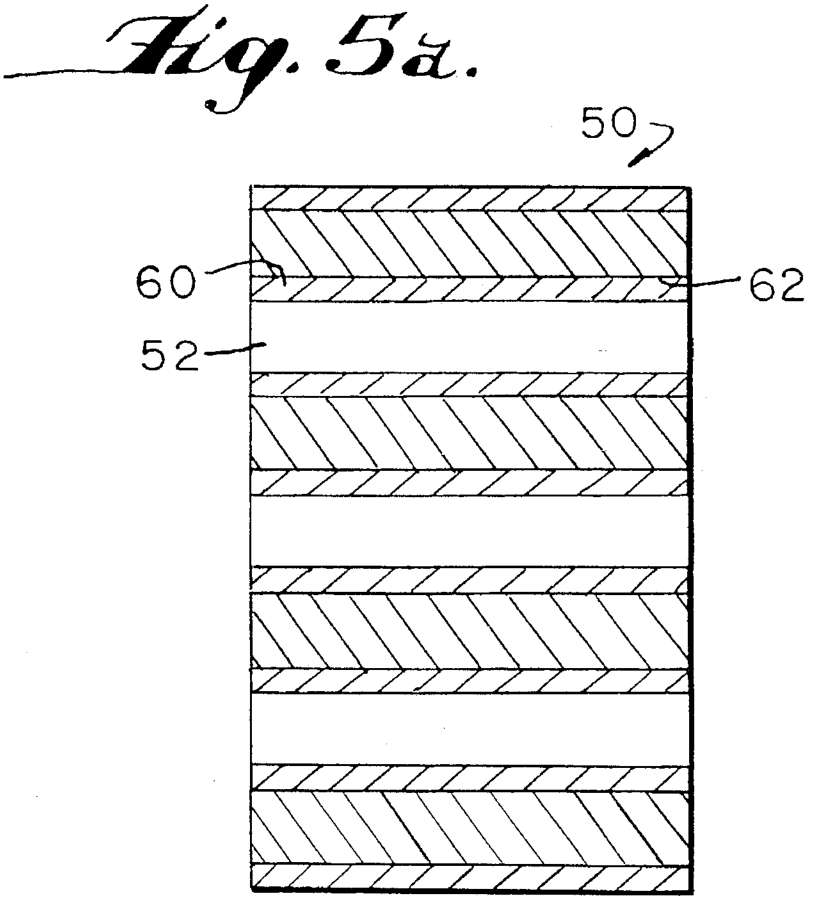
FIG. 5A is a cross-section of a substrate in which a dielectric film has been formed on the walls of the pores.

Another method for electrically isolating the substrate shown in FIG. 5A, is to deposit a dielectric film 60 directly on the channel walls 62 by chemical vapor deposition (CVD). Material systems which are suitable for this application include silicon oxide ($Si_xO_y$), silicon nitride ($Si_xN_y$), and silicon oxynitride ($Si_xO_yN_z$). These materials may be deposited from the precursor system of $SiH_2Cl_2/N_2O/NH_3$, where the fraction of ammonia and nitrous oxide precursors are varied to produce films with the desired fractions of oxygen and nitrogen respectively. This precursor system deposits conformally in high-aspect-ratio channels, thus making it a viable system for isolating channels by CVD. In general, CVD processing may be carried out at reduced pressures (generally between 0.1 torr–3 torr) in a temperature range between about 800° and about 900° C. Isolating the substrate by CVD deposits material directly on the channel wall 62 and thus reduces the width (D) of the pore without consuming the silicon wall. Thus, α increases as does the overall wall thickness.

Figure 5B:
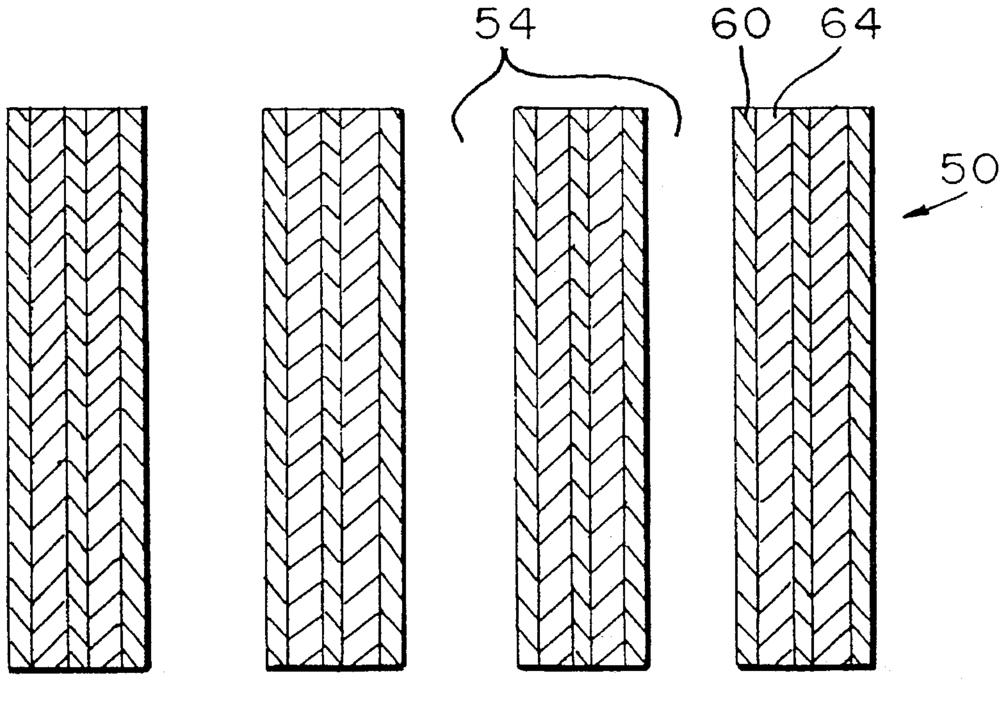
FIG. 5B is a cross-section of the substrate illustrated in FIG. 5A in which an insulating oxidized layer and an overlying semiconductive film have been formed as a composite isolation layer.

The two methods described herein for isolating the substrate may be combined to form a composite isolation layer, as shown in FIG. 5B. The silicon substrate 50 is first thermally oxidized, to produce oxide layer 64; and then, additional insulation may be provided by the layer of film 60 deposited on the thermal oxide layer 64 by CVD. The deposition of material directly on the wall may be used to increase the aspect ratio to a value necessary to support electron multiplication.

Figure 5C:
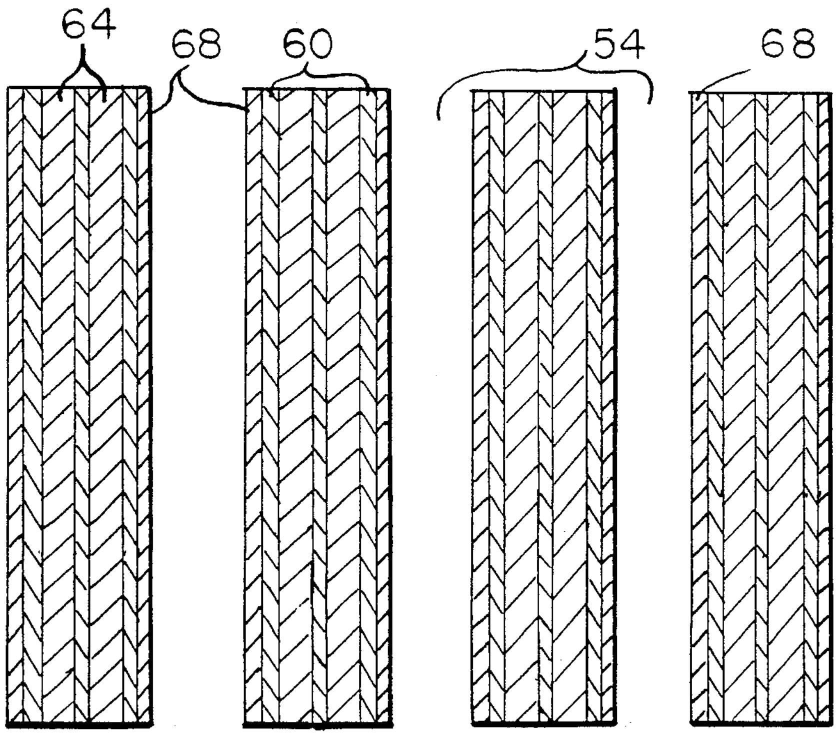
FIG. 5C is a cross-section of the substrate illustrated in FIG. 5B in which a semiconductive film has been formed on the isolation layer.

After electrical isolation, a semiconductive layer 68 may be deposited on the insulated substrate by CVD, as shown in FIG. 5C. Nitrogen-doped silicon is one material that can be used. The film may be formed from a $SiH_2Cl_2/NH_3$ precursor system, to produce a highly conformal film in the high-aspect-ratio channels. This process generally may be carried out at reduced pressures (30 to 300 mtorr) and in a temperature range between about 750° and about 850° C. The electrical resistivity of these films may be controlled by varying the ratio of the precursors during deposition, generally between ~10:1 to ~4:1 $SiH_2Cl_2/NH_3$. Sheet resistances ($R_s=10^{11}$–$10^{14}$ Ω/Sq.) of this semiconductor layer are suitable for MCPs. The addition of this material to the channel walls increases the aspect ratio of the channel. See also, U.S. Pat. No. 5,378,960 which describes other methods of producing thin-film dynodes.

Figure 5D:
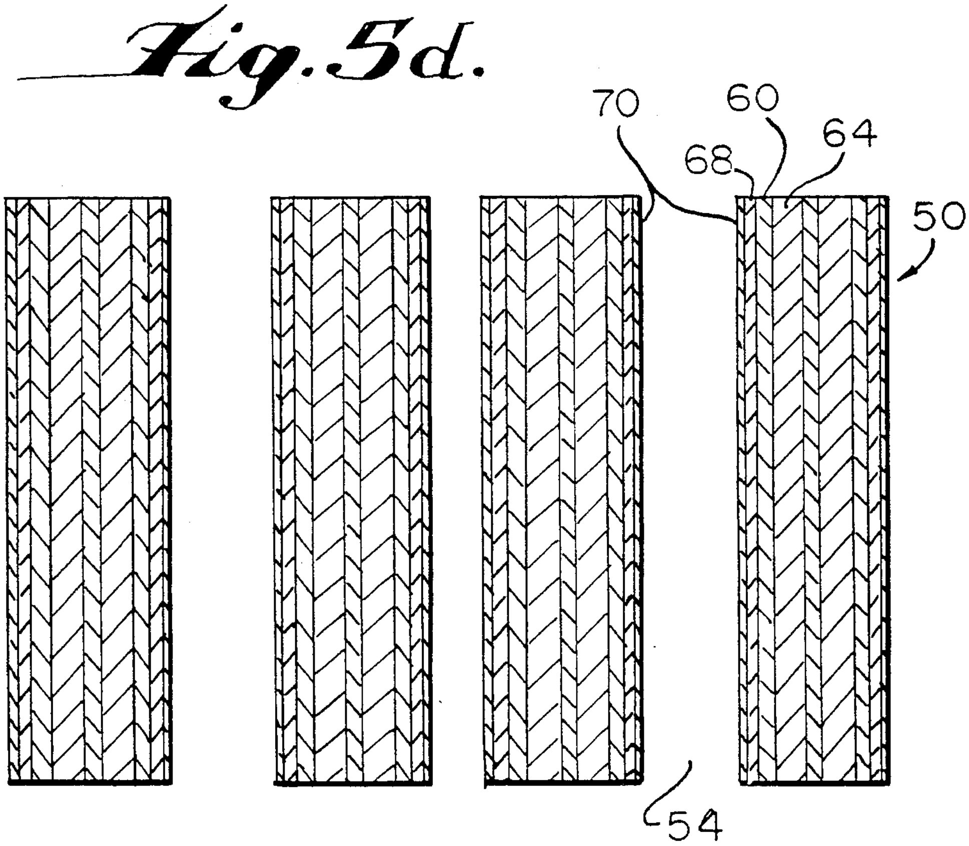
FIG. 5D is a cross-section of the substrate illustrated in FIG. 5C in which an emissive layer has been formed on the semiconductive layer.

The final step in activating the channels is to form a secondary-electron emissive layer 70 on the conductive layer 68, as shown in FIG. 5D. This may be done by chemical vapor deposition of a dielectric, including silicon oxide, silicon nitride, or silicon oxynitride from the $SiH_2Cl_2/N_2O/NH_3$ precursor system. The CVD may generally be conducted at a relatively low temperature (~700° C.) to reduce the deposition rate and to produce maximum conformality in the channel. Other methods of producing thin-film dynodes are incorporated herein by reference to U.S. Pat. No. 5,378,960.

Another method of forming an emissive layer 70 is by direct thermal conversion of the surface 72 of the silicon-containing conductive film 68 by oxidation or nitridation. A silicon oxide emissive layer 70 may thus be formed by oxidizing the same conductive layer in oxygen or steam. A silicon nitride emissive layer 68 may be formed by heating the semiconductive layer in ammonia. Silicon oxynitride may be formed by heating the semiconductive layer in nitrous oxide. An oxynitride film may also be formed by heating an existing silicon dioxide layer in ammonia to incorporate nitrogen in the film.

Listed below are a series of exemplary process steps in the various embodiments described above:

| | |
|---|---|
| **Oxidation for Wall Thinning and Electrical Isolation** | |
| Temperature: | 1150° C. |
| Gas Flows: | $O_2$ - 1.25 slm<br>$H_2$ - 2.25 slm<br>TCA - Cl 4% of $O_2$ |
| Pressure: | 1 atmosphere |
| Time: | 80 to 100 minutes |
| Thickness: | ~0.9 μm |
| **Nitride Deposition for Electrical Isolation** | |
| Temperature: | 850° C. |
| Gas Flows: | Dichlorosilane ($SiH_2Cl_2$) - 47 sccm<br>Ammonia ($NH_3$) - 11 sccm |
| Pressure: | 0.1 to 3 torr |
| Time: | 20 to 60 minutes |
| Thickness: | ~150–300 nm |
| **Semiconductive Film Deposition** | |
| Temperature: | 800° C. |
| Gas Flows: | Dichlorosilane ($SiH_2Cl_2$) - 47 sccm<br>Ammonia ($NH_3$) - 4 sccm |
| Pressure: | 30 to 300 mtorr |
| Time: | 30 to 40 minutes |
| Thickness: | ~120 nm |
| **Emissive Film Deposition** | |
| Temperature: | 700° C. |
| Gas Flows: | Dichlorosilane ($SiH_2Cl_2$) - 47 sccm<br>Ammonia ($NH_3$) - 11 sccm |
| Pressure: | 100 to 300 mtorr |
| Time: | 8 to 10 minutes |
| Thickness: | ~5 nm |

Figure 6A:
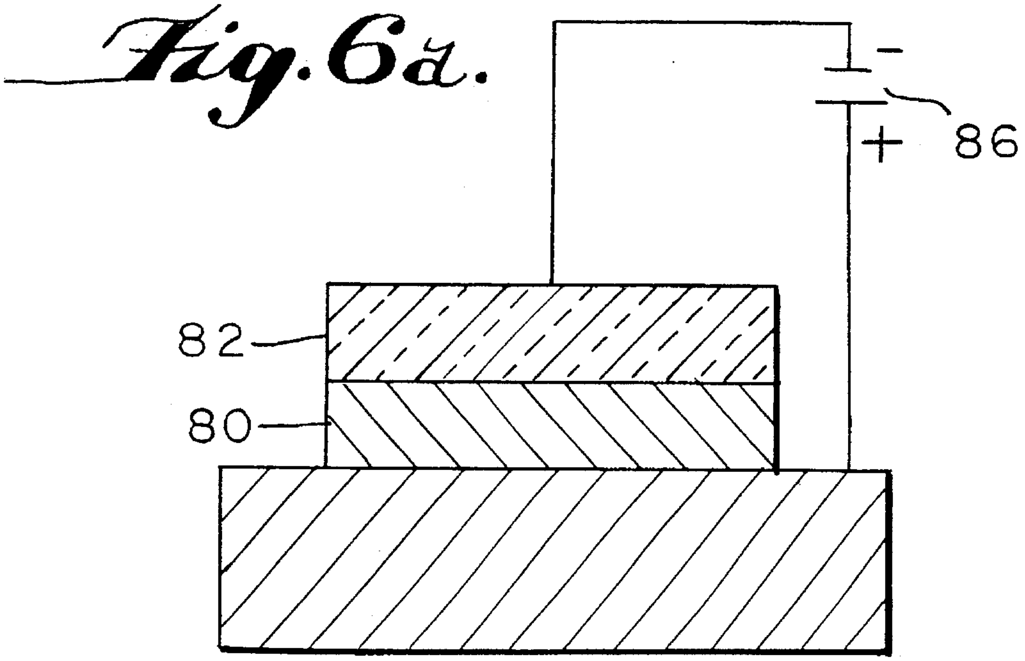
FIGS. 6A and 6B are schematic illustrations of a fusion bonding technique herein described.

A distinct advantage to silicon based MCPs is the ability to apply other bulk and surface micromachining techniques. This has application in two specific areas both of which take advantage of direct fusion bonding and field-assisted thermal or anodic bonding techniques illustrated in FIGS. 6A and 6B. Direct fusion bonding is a thermally driven process by which two clean, flat surfaces are fused. By heating the two surfaces 80 and 82 in contact to high temperature (800° to 1200° C.), generally for several hours, a permanent bond is form between the two pieces. Anodic bonding is an electrochemical process for low temperature (300° to 600° C.) fusion or sealing of alkali containing glass 82 to metal or semiconductors 80, 80A and 80B. It is accomplished by heating the materials in contact and then applying a positive bias 86 to the metal or semiconductor 80A, relative to the previously bonded glass semiconductive pair 82-80B, of the order of 100 to 1000 volts. Bonding can then take as little as several minutes depending primarily on the voltage, temperature, and component stack.

Figure 6B:
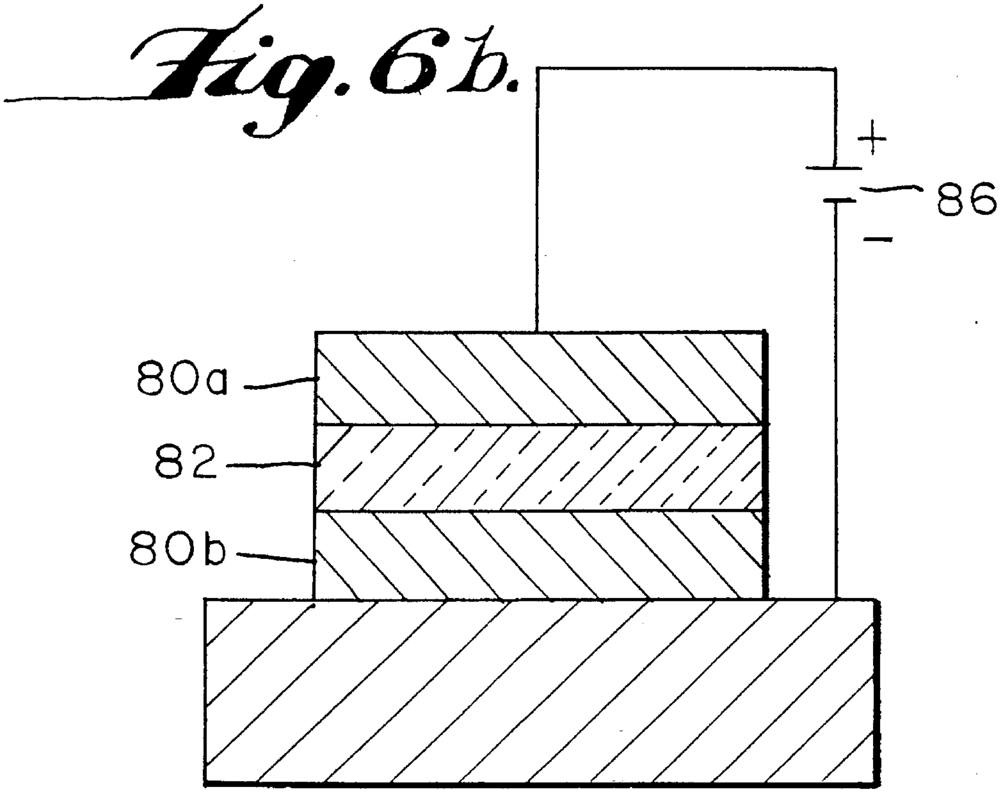

An application of bonding techniques available with a Si based micromachined MCP manufactured according to the invention relates to assembly of a low-cost, ultra-compact image or photomultiplier tubes using anodic bonding. It should be understood that an image tube and a photomultiplier tube differ mainly in application and in photocathode material. For example, the semiconductor substrate in FIG. 6A may be an MCP bonded or sandwiched to a glass window by means of anodic bonding. Additionally, substrates can be bonded to the fused stack of substrates and windows, one at a time by alternating glass and semiconductor substrates, as shown in FIG. 6B. Important considerations in employing such a bonding method are the relative thermal expansion of the materials used and the cleanliness and flatness of the surface to bonded.

Figure 7A:
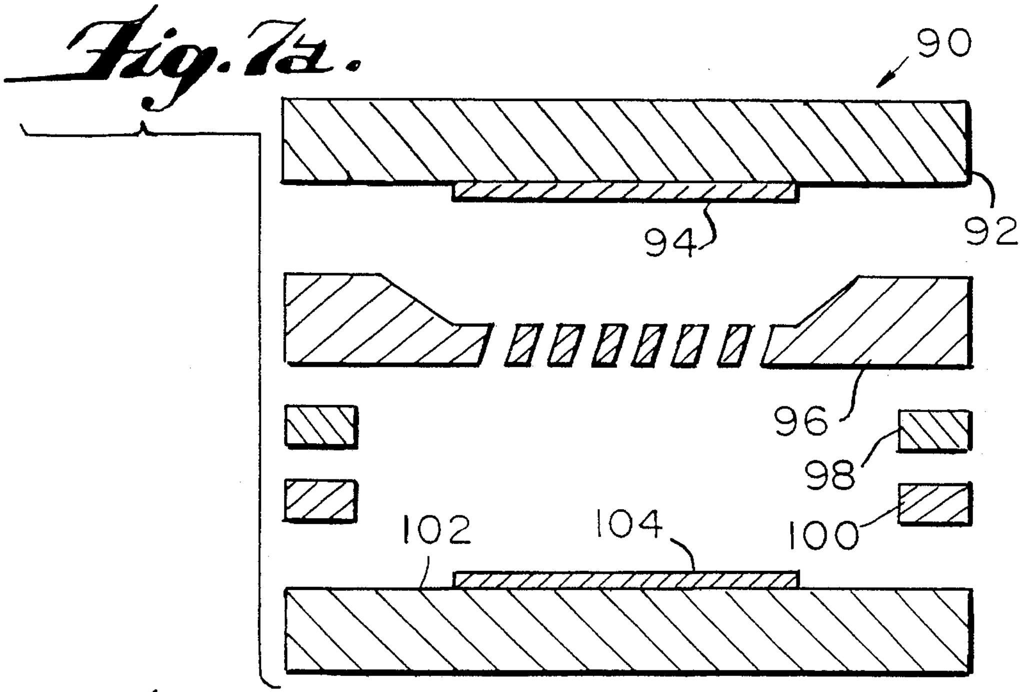
FIGS. 7A and 7B are respective exploded and assembled side sectional views of an integrated device manufactured in accordance with the teachings of the invention.
Figure 7B:
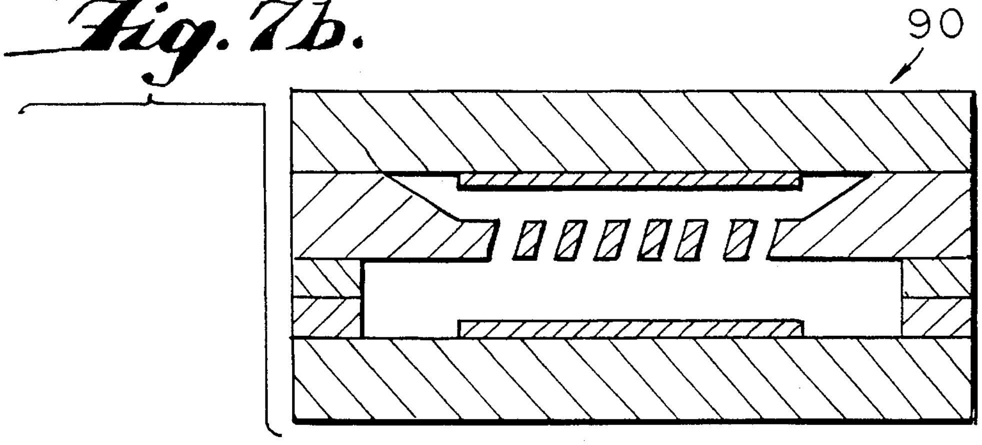

The components layers for an image tube or photomultiplier 90 tube would include an MCP as herein described or as described in U.S. Pat. No. 5,086,248, the teachings of which are incorporated herein by reference. The arrangement, illustrated in FIGS. 7A and 7B in respective exploded and assembled forms, includes a glass window 92, with photocathode 94, micromachined MCP 96, a glass spacer 98, a silicon spacer 100, and a glass window 102 having a phosphor screen 104. Once the elements are bonded in vacuum, the image tube having a integrated structure results, as shown in FIG. 7B. The bonding procedure can be practiced to produce micromachined image tubes or photomultiplier tubes with electronic readouts (e.g., CCDs and CIDs). The image and photomultiplier tubes thus produced are compact and modular in design. Exemplary dimensions of the various layers are set forth below.

| Layer | | Material | Thickness |
|---|---|---|---|
| Input Window | 92 | Pyrex Glass | ~1.0 mm |
| MCP | 96 | $Si/SiO_2$ | ~0.5 mm |
| Spacer | 98 | Pyrex | ~0.5 mm |
| Spacer | 100 | Si | ~0.5 mm |
| Window | 102 | Pyrex | ~1.0 mm |
| Overall Dimensions | | Si/Pyrex/ $SiO_2$ | ~3.5 mm |

Another application of bonding techniques, available with Si based micromachined MCPs, is for multiply stacked, high gain ($10^6$–$10^8$), high resolution (≧50 lp/mm), detectors. Traditionally, MCPs are stacked together to form high gain detector free from ion feedback. This is accomplished by physically holding two or more MCPs together with opposing bias angles. The lack of long range order in the arrangement of channels in RLSG MCPs militates against one-to-one channel registration between the two or more stacked MCPs, resulting in a reduction in spatial resolution. For example, a single RLSG MCP with D=10 μm and P=12 μm would have a resolution of about 25 to 40 lp/mm depending on the assembly and operation of the detector. Two such MCPs, arranged in confronting relation with reverse bias angles, would have a spatial resolution of about 16 to 25 lp/mm. An arrangement of three such MCPs, necessary for very high gains ($10^8$), results in a resolution of about 8 to 12 lp/mm.

Figure 8:
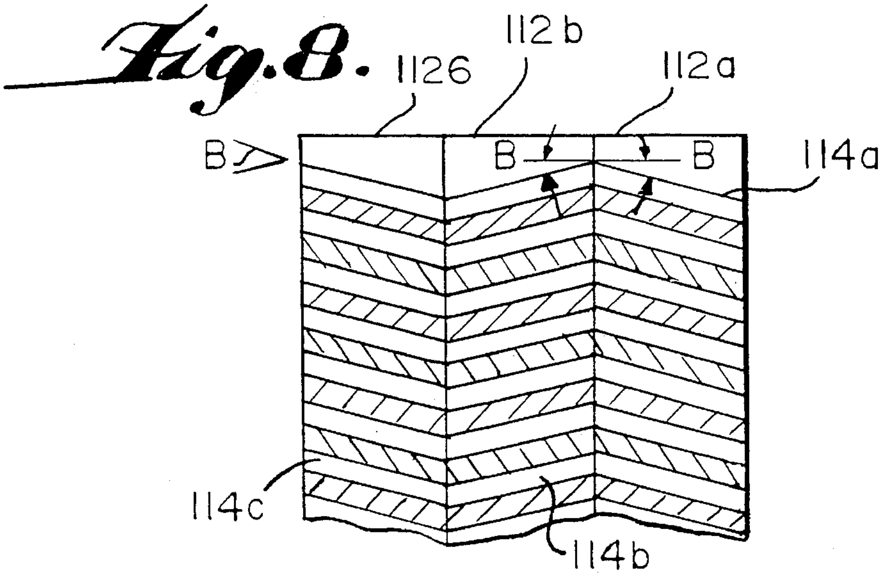
FIG. 8 is a cross-section of a stack of MCPs arranged in a multistage device.

By relying on the long range order of channels defined by lithographic techniques available with micromachined MCPs, a stack 110 of MCPs 112A–112C each having the same bias angle B may be bonded, as shown in FIG. 8, which maintain one-to-one channel registration of the respective channels 114A–114C through the stack. This results in no loss of spatial resolution. Thus, it is possible to have an micromachined MCP based detector with $10^8$ gain and a spatial resolution >100 lp/mm.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. A method for manufacturing a microchannel plate electron multiplier comprising the steps of:

defining an array of pores in an etchable substrate;

photoelectrochemically etching on the substrate to produce highly anisotropic pores having wall portions in the substrate in accordance with a defined array; and activating the pores to produce a thin-film dynode with an electron emissive surface on the wall portions of the pores.

2. The method according to claim 1 further comprising the step of electrically isolating the substrate from the electron emissive surface.

3. The method according to claim 2 wherein the electrically isolating step comprises the step of at least one of oxidizing and nitriding the substrate to produce a dielectric layer thereon.

4. The method according to claim 3 wherein the step of producing the dielectric layer is conducted at about 1 atmosphere.

5. The method according to claim 3 wherein the step of producing the dielectric layer is at a temperature in a range of about 1000° and about 1200° C.

6. The method according to claim 2 wherein the electrically isolating step comprises forming a dielectric layer by chemical vapor deposition (CVD).

7. The method according to claim 6 wherein the CVD step is carried out at a pressure in a range of about 0.1 torr and about 3 torr.

8. The method according to claim 6 wherein the CVD step is carried out at a temperature in a range of about 800° and about 900° C.

9. The method according to claim 2 wherein the electrical isolating step comprises forming a dielectric surface layer on the wall portions of the pores by at least one of CVD, oxidizing and nitriding.

10. The method according to claim 1 wherein the actuation step comprises the step of forming a semiconductor layer between the substrate and the electron emissive surface by chemical vapor deposition (CVD).

11. The method according to claim 10 wherein the step of forming the semiconductive layer is conducted at a pressure in a range of about 30 and about 300 mtorr.

12. The method according to claim 10 wherein the step of forming the semiconductive layer is conducted at a temperature of about 800°.

13. The method according to claim 10 wherein the activation step further comprises forming the electron emissive surface by at least one of oxidizing and nitriding the semiconductor layer.

14. The method according to claim 1 wherein the activation step comprises forming the emissive layer by chemical vapor deposition (CVD).

15. The method according to claim 14 wherein the CVD step is conducted at a pressure in a range of about 100 and about 300 mtorr.

16. The method according to claim 14 wherein the CVD step is conducted at a temperature of about 700° C.

17. The method according to claim 1 wherein the step of defining the array of pores comprises the step of arranging a pattern of pores in one of a hexagonal and rectangular arrangement being defined by a pore width D, a spacing or pitch P between adjacent pores and a corresponding wall thickness W defined by the pitch minus the pore width.

18. The method according to claim 17 further including the steps of oxidizing the substrate to produce an oxide growth layer; and etching the growth layer to thereby increase the pore width and reduce the wall thickness without changing the pitch.

19. The method according to claim 1 further including the step of oxidizing the substrate.

20. The method according to claim 19 further comprising the step of constraining the workpiece during the oxidation step.

21. The method according to claim 20 wherein the constraining step is carried out at a force of about 100 $gm/cm^2$.

22. The method according to claim 1 wherein the constraining step is conducted with materials which do not adhere to the substrate.

23. A device manufactured according to claim 1 including at least one of a photomultiplier tube, an image intensifier tube and a high gain imaging stack.

* * * * *